(12) United States Patent
Rose et al.

(10) Patent No.: US 6,245,686 B1
(45) Date of Patent: Jun. 12, 2001

(54) PROCESS FOR FORMING A SEMICONDUCTOR DEVICE AND A PROCESS FOR OPERATING AN APPARATUS

(75) Inventors: Jeffrey D. Rose; Michael J. Hartig; David G. Farber; Danny R. Babbitt; Jason A. Rivers, all of Austin; Ai Koh, Cedar Park; Terry G. Sparks, Austin, all of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/586,828

(22) Filed: Jun. 5, 2000

(51) Int. Cl.$^7$ .................... H01L 21/302; H01L 21/461
(52) U.S. Cl. .................. 438/729; 438/729; 438/730; 438/731; 438/798; 427/569
(58) Field of Search .................. 438/729, 730, 438/731, 798; 427/569; 118/723 R, 723 I, 723 IR

(56) References Cited

U.S. PATENT DOCUMENTS

| | | |
|---|---|---|
| 5,158,644 * | 10/1992 | Cheung et al. .................. 156/643 |
| 5,556,713 | 9/1996 | Leverant .................. 428/610 |
| 5,683,458 | 11/1997 | Hartig et al. .................. 156/643.1 |
| 6,046,425 * | 4/2000 | Kaji et al. .................. 219/121.43 |
| 6,193,802 * | 2/2001 | Pang et al. .................. 118/715 |

* cited by examiner

*Primary Examiner*—John F. Niebling
*Assistant Examiner*—Alexander G. Gayka

(57) ABSTRACT

A process for forming a semiconductor device includes placing a substrate (104) into an apparatus (300), creating a plasma, and processing the substrate (104). The apparatus (300) includes an electromagnetic source (120), a bulk material (302), and a first barrier layer (304). The bulk material (302) is between the electromagnetic source (120) and an interior (126) of the apparatus (300). The first barrier layer (304) is between the bulk material (302) and the interior (126). A process for operating an apparatus (300) includes forming a polymer layer along an inorganic layer (302, 306 or 702), wherein the polymer layer is formed within the apparatus (300); removing the polymer layer to expose the inorganic layer (302, 306, or 702); and etching at least a portion of the exposed inorganic layer (302, 306, or 702). Typically, the inorganic layer (203, 306, or 702) is semiconductive or resistive.

20 Claims, 3 Drawing Sheets

PROCESS FOR FORMING A SEMICONDUCTOR DEVICE AND A PROCESS FOR OPERATING AN APPARATUS

FIELD OF THE INVENTION

The present invention relates to the field of semiconductor fabrication and more particularly to a semiconductor wafer processing apparatus including a barrier layer material that facilitates refurbishing of the apparatus.

BACKGROUND OF THE INVENTION

In the field of semiconductor fabrication, a variety of process steps results in the contamination of the apparatus or equipment used to perform a particular processing step. FIG. 1 depicts a conventional wafer processing apparatus 100 illustrative of a high density plasma (HDP) reactor including a semiconductor plate 109 and quartz sidewalls 112 that define a chamber 106. Apparatus 100 includes an electrostatic chuck (ESC) 102 that is suitable for receiving a semiconductor wafer 104 within chamber 106 and a set of coils 108 configured to produce an electromagnetic field within chamber 106.

Introducing appropriate gases into chamber 106 when the coils 108 are producing an electromagnetic field while maintaining chamber 106 at an appropriate pressure will result in the formation of a plasma as is well known in the field. In one embodiment, the plasma generated in chamber 106 is used to etch material from wafer 104, which typically includes numerous layers of differing materials. During the plasma etch of one of the materials, it is possible to expose portions of an underlying material.

When portions of an underlying material are exposed, the plasma in chamber 106 may generate atomic particles comprised of the underlying materials. During a plasma etch of an interlevel dielectric, for example, it is possible to release metallic particles (or other contaminants) from an underlying interconnect layer into chamber 106. The presence of these metallic particles in chamber 106 during a plasma etch may result in an undesired diffusion or high energy physical implant process in which the metallic particles are incorporated into the surfaces, such as plate 109, of apparatus 100 that are exposed to chamber 106. In fabrication processes utilizing copper interconnects, for instance, a post-copper oxide etch process, such as a via etch, may introduce copper atoms into plate 109 and sidewalls 108.

FIG. 2 depicts an alternative embodiment of apparatus 100 illustrating an inductively coupled, parallel plate etch system. This embodiment of apparatus 100 includes a set of coils 120 that are configured to form an electro-magnetic field in a chamber 116 that is substantially enclosed by silicon dome 110. As depicted in FIG. 2, system 100 may further include quartz lights or heat lamps 122. Apparatus 100 of FIG. 2 is suitable for a variety of processes including the dielectric etch process described with respect to apparatus 100 of FIG. 1. Similar to apparatus 100 of FIG. 1, a semiconductor process, such as a plasma oxide etch, performed in apparatus 100 of FIG. 2 may result in the unwanted contamination of silicon dome 110 that can affect the generated plasma and result in an etch stop condition.

In some of the more common materials (e.g., silicon) typically utilized for plate 109 of FIG. 1 and dome 110 of FIG. 2 (collectively referred to herein as enclosures), copper atoms are believed to be highly mobile. As these mobile and conductive particles are introduced into an enclosure, the electrical characteristics of the enclosure may be affected thereby altering the characteristics of the electromagnetic field produced by coils 108 and 120 in chambers 106 and 116 respectively. The alteration of the electromagnetic field by the presence of mobile contaminants in an enclosure may negatively affect the plasma characteristics and possibly result in a less efficient etch process. If the plasma is sufficiently affected by the presence of conductive particles in the enclosure, an etch stop condition may result in which the process is entirely unable to etch vias into an oxide layer of wafer 104.

In addition, typical etch processes such as the plasma etch of silicon-oxide films utilizing a carbon fluorine chemistry tend to result in the formation of a polymer layer on the exposed surfaces of an enclosure. If the thickness of the polymer layer formed on the enclosure is sufficient, the dome may be unable to contribute silicon or other atoms that participate in the chemistry of the plasma etch process thereby further decreasing the efficiency of the process.

In the apparatus 100 of both FIG. 1 and FIG. 2, a contaminated plate 109 or dome 110 resulting from extended processing typically requires periodic replacement or refurbishing. Typically, the replacement of plate 109 or dome 110 is undesirably costly. In addition, conventional methods of refurbishing enclosures typically require bead blasting or other similarly crude cleaning processes necessitating the removal of the enclosure from apparatus 100. After an enclosure is refurbished, it must be reinstalled on apparatus 100 and re-qualified. Skilled artisans appreciate that the removal and requalification of an enclosure can be a costly and time-consuming process. Therefore, it would be highly desirable to implement an apparatus and method that would minimize or eliminate overhead associated with replacing or refurbishing an enclosure such as plate 109 or dome 110.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A process for forming a semiconductor device includes placing a substrate into an apparatus, creating a plasma, and processing the substrate. The apparatus includes an electromagnetic source, a bulk material, and a first barrier layer. The bulk material is between the electromagnetic source and an interior portion of the apparatus. The first barrier layer is between the bulk material and the interior. A process for operating an apparatus includes forming a polymer layer along an inorganic layer, wherein the polymer is formed within the apparatus; removing the polymer layer to expose the inorganic layer; and etching at least a portion of the exposed inorganic layer. Typically, the inorganic layer is semiconductive or resistive. The present invention is defined by the claims and is better understood after reading the description o the figures that follow.

Figure 1:
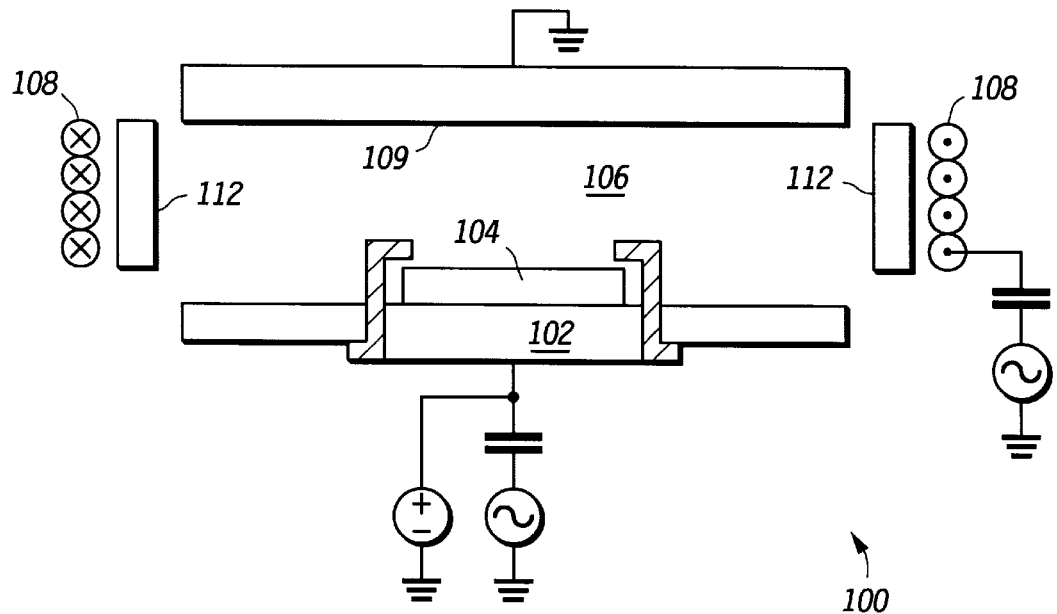
FIG. 1 is a diagram of a semiconductor wafer processing apparatus according to the prior art.
Figure 2:
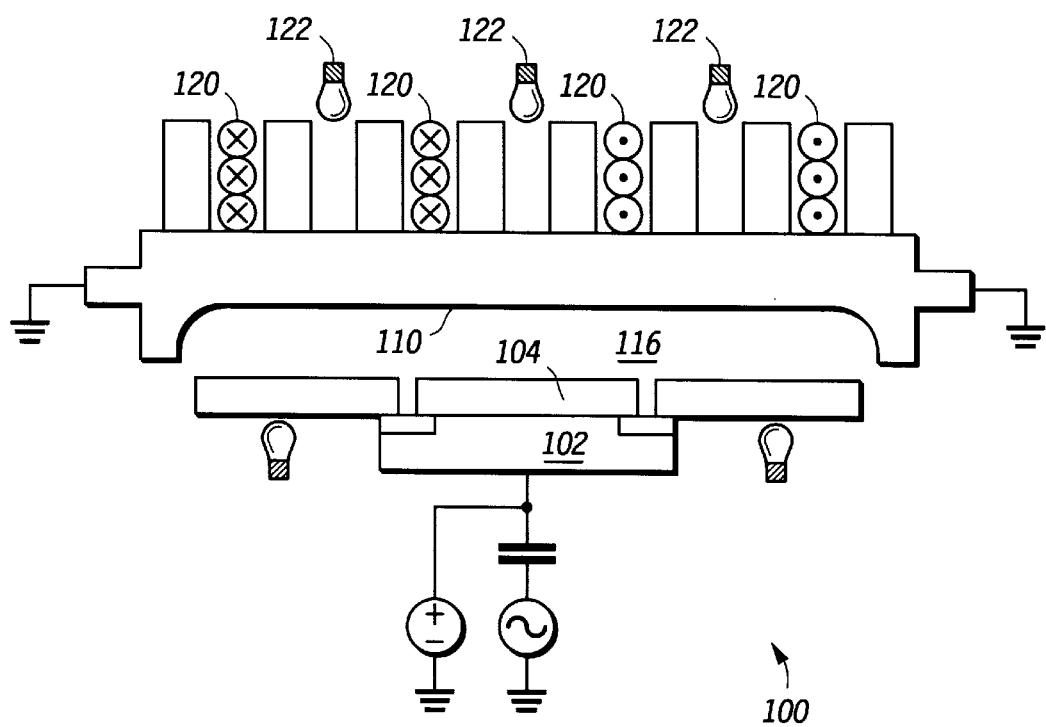
FIG. 2 is a diagram of an alternative embodiment of a wafer processing apparatus according to the prior art.
Figure 3:
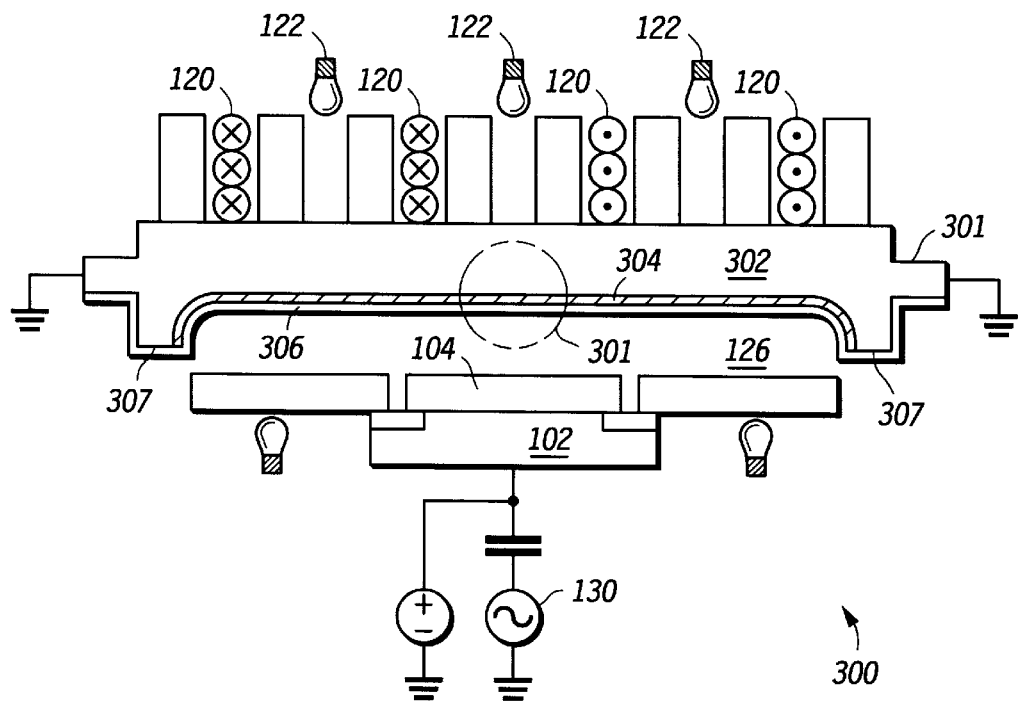
FIG. 3 illustrates a wafer processing apparatus according to one embodiment of the present invention.

Turning now to the drawings, FIG. 3 includes a diagram of a wafer processing apparatus 300. In the depicted embodiment, apparatus 300 is suitable for creating a plasma to process a semiconductor wafer to form a semiconductor device. In this embodiment, apparatus 300 includes a source of electromagnetic energy, such as coils 120. In one embodiment, coils 120 are driven by a radio frequency (RF) power source that produces an electro-magnetic field in an interior portion (chamber) 126 of apparatus 300.

A wafer (substrate) 104 is placed on electrostatic chuck 102 within apparatus 300 with its upper surface exposed to chamber 126. In the depicted embodiment, electrostatic chuck 102 is driven by a RF power source 130 while coils 120 are driven by an independent RF source (not depicted). In the depicted embodiment, electrostatic chuck 102 comprises a ceramic material, such as, for example, aluminum nitride (AlN). In other embodiments, electrostatic chuck 102 may be comprised of a material, such as polyimide or a metal. In still other embodiments, electrostatic chuck 102 may be replaced by a suitable wafer clamping system as is familiar to skilled artisans in the field of semiconductor fabrication equipment.

Embodiments of the invention are described with respect to a particular plasma process, namely, the plasma etch of a dielectric film formed over a conductive material such as a copper interconnect. Although the depicted embodiment is described with respect to a specific process, skilled artisans in wafer fabrication appreciate the benefit of this disclosure that the invention is applicable to a variety of processing steps in which at least a portion of a first film (e.g., a dielectric) overlying a wafer is removed thereby exposing an underlying film (e.g., an interconnect level) that includes a contaminant (e.g., copper) that may reach an exposed surface of apparatus 300.

Plasma etching of dielectric films with apparatus 300 is facilitated, according to one embodiment, by employing a dome 301 that includes a material suitable for participating in the chemistry of the etch process. In addition, the resistivity of dome 301 is preferably maintained within a specified range to insure that dome 301 has sufficient conductivity to maintain dome 301 at a ground potential while simultaneously providing a vehicle for coupling the electromagnetic field produced by coils 120 to chamber 126.

During a high-density plasma etch of a dielectric film formed over a copper interconnect layer, copper-bearing contaminants, such as copper fluoride or atomic copper, are inevitably introduced into chamber 126 of apparatus 300 through a quasi-sputtering mechanism. A portion of the copper contaminants that are released into chamber 126 contact dome 301. In various embodiments of apparatus 300, dome 301 comprises a semiconductor material such as silicon, silicon carbide, germanium, or silicon germanium. In addition to providing a suitable vehicle for transmitting the electromagnetic field generated by coils 120, the semiconductor material of dome 301 may contribute to the chemical reaction in chamber 126 during the etch process. An inductively coupled, parallel plate, semiconductor source etch system, such as a Dielectric Etch IPS Centura® system from Applied Materials, Inc. of Santa Clara, Calif. is exemplary of an etch system employing a semiconductor dome.

Because the mobility of copper in semiconductors, such as silicon, is relatively high, copper contaminants (or other contaminants) tend to migrate throughout the dome thereby altering the dome composition and potentially changing the etch process characteristics. In addition, if the mobile contaminants are sufficiently conductive, the plasma itself may be affected by a change in the conductivity of dome 301 as significant amounts of conductive contaminants are incorporated into dome 301. Specifically the widespread distribution of such contaminants throughout dome 301 could adversely affect the electro-magnetic field within chamber 126 thereby resulting in a less dense plasma and a less efficient etch process. Thus, the contaminants may be capable of significantly affecting the electromagnetic field within apparatus 300. It should be noted that, in addition to copper, the contaminants may include other metals, Group III species such as boron, or Group V species, such as phosphorous or arsenic.

As depicted in FIG. 3, dome 301 of apparatus 300, according to one embodiment of the present invention, includes a bulk material 302 and a first barrier layer 304. Bulk material 302 is located between electro-magnetic source 120 and chamber 126 of apparatus 300, while first barrier layer 304 is situated between bulk material 302 and chamber 126. In the depicted embodiment, a first active layer 306 is positioned between the bulk material 302 and chamber 126. Bulk material 302 may include a semiconductor material, such as silicon, silicon carbide, germanium, or silicon germanium. Barrier layer 304 is preferably suitable for preventing particles or other contaminants generated during processing of semiconductor wafer 104 from diffusing to bulk material 302 of dome 301. Barrier layer 304 may include a material, such as, for example, a refractory metal or a nitride, such as silicon nitride.

The embodiment of dome 301 depicted in FIG. 3 further includes a first active layer 306 located between barrier layer 304 and chamber 126 of apparatus 300. "Active" is being used to note that the layer is participating during a processing activity. Bulk material 302 and first active layer 306 may have similar electrical, magnetic, or chemical properties. In an embodiment in which bulk material 302 comprises a semiconductor, for example, first active layer 306 may comprise the same or a similar semiconductor material, such as silicon, silicon carbide, germanium, or silicon germanium. In another embodiment, bulk material 302 may comprise an electrical insulator, such as silicon oxide, aluminum oxide, or aluminum nitride. In this embodiment, first active layer 306 may also comprise silicon oxide, aluminum oxide, aluminum nitride, or other suitable electrical insulator.

Figure 7:
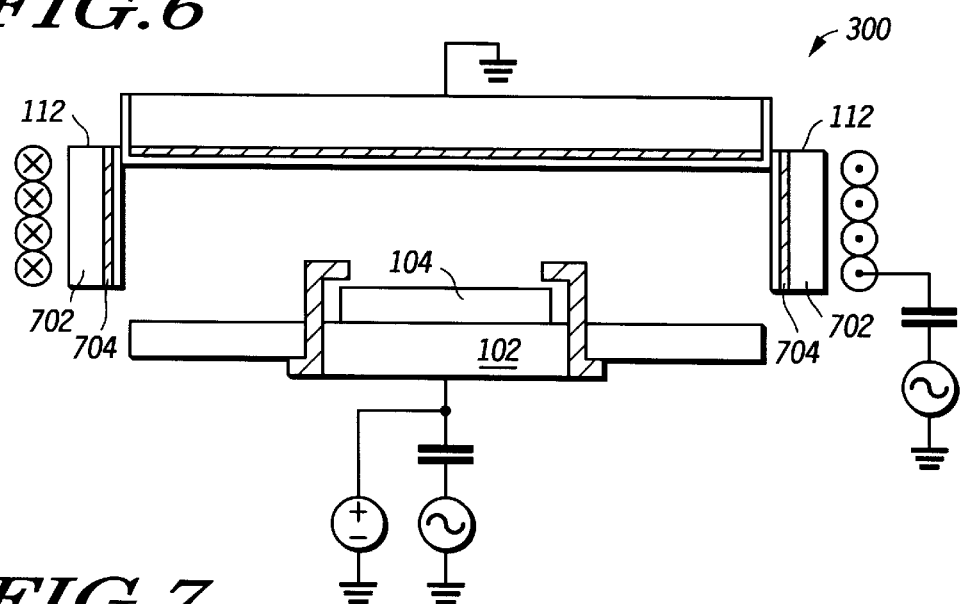
FIG. 7 is a diagram of a wafer processing apparatus according to one embodiment of the present invention.

Referring momentarily to FIG. 7, the depicted embodiment of apparatus 300 includes a liner 112 that forms the sidewalls of apparatus 300. In one embodiment, liner 112 includes a bulk material 702, such as silicon dioxide or quartz and a barrier layer 704 comprised of a material such as silicon or silicon nitride. Barrier layer 704 is suitable for use in embodiments in which it is desirable to guard against sodium (mobile ion) contaminants, which tend to migrate rapidly in silicon dioxide or quartz. A silicon nitride barrier layer 704 is suitable for use in embodiments in which it is desirable to prevent copper from penetrating into the quartz bulk material 702.

Returning now to FIG. 3, bulk material 302, which may be electrically grounded during wafer processing, and first active layer 306 may be electrically connected to one another to maintain first active layer 306, which is exposed to the chamber 126 of apparatus 300, at a desired potential during wafer processing. The electrical connection between first active layer 306 and bulk material 302 is located at an exterior portion of chamber 126. In the embodiment depicted in FIG. 3, first active layer 306 and bulk material 302 are electrically connected through a physical contact between them as indicated by reference numeral 307.

Figure 4:
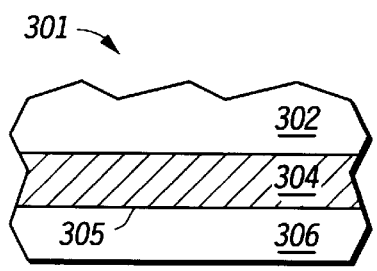
FIG. 4 is a detailed view of the layers comprising the dome of the wafer processing apparatus of FIG. 3 according to one embodiment of the present invention.

To prevent migration of mobile and conductive particles, barrier layer 304 is formed in close proximity to the surface 305 of first active layer 306 (as shown in FIG. 4). In one embodiment, the thickness of first active layer 306 is in excess of approximately 11 microns while the thickness of first barrier layer 304 is in the range from approximately 11 nanometers to 9 microns. As the concentration of mobile particles within first active layer 306 increases beyond a specified threshold, the resistivity of first active layer 306 may drop below an optimal value. If the resistivity of first active layer 306 drops sufficiently, the plasma density/uniformity may also drop thereby possibly resulting in a degraded etch process.

Figure 5:
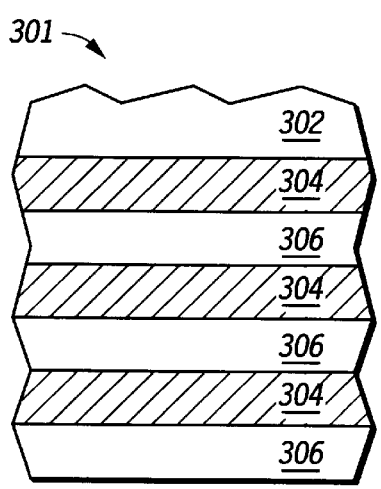
FIG. 5 illustrates an alternative embodiment of the dome of the wafer processing apparatus of FIG. 3.

FIGS. 4 and 5 illustrate detailed portions of dome 301 according to alternative embodiments. In the embodiment depicted in FIG. 4, a single active layer 306 and a single barrier layer 304 are formed in contact with bulk material 302. In contrast, the embodiment depicted in FIG. 5 includes a succession of layers, each of which includes a barrier layer 304 and an active layer 306. Thus, in FIG. 5, a set of barrier layers 304 and a set of active layers 306 are alternately formed on bulk material 302. The embodiment depicted in FIG. 5, in which multiple sets of active and barrier layers are formed, is suitable for use with a process in which the various layers are periodically removed to expose the underlying layers as the previous layers become contaminated. In the embodiment depicted in FIG. 4, the active layer 306 may be periodically removed and re-deposited on barrier layer 304 as a means of maintaining or refurbishing dome 301. In another embodiment, both active layer 306 and barrier layer 304 may be removed and re-deposited as a means of refurbishing dome 301.

Figure 6:
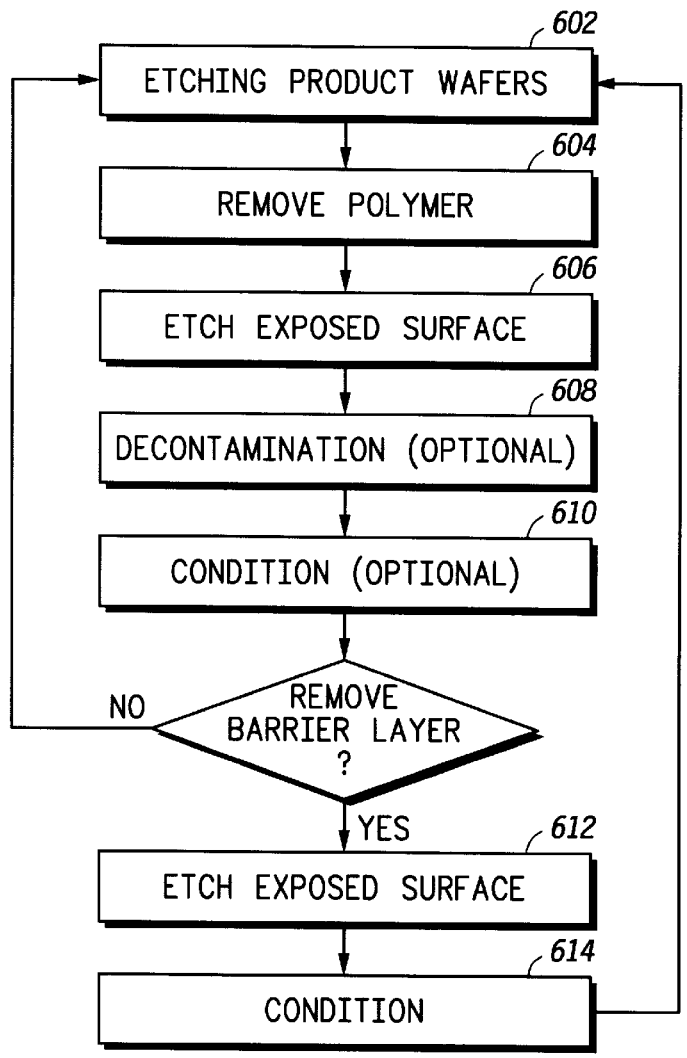
FIG. 6 is a flow diagram of a process for operating a semiconductor wafer processing apparatus according to one embodiment of the present invention.

Turning now to FIG. 6, a flow diagram illustrating a process 600 for refurbishing a surface within an apparatus, such as apparatus 300, is depicted. Initially, a polymer layer may be formed on the surface of an inorganic layer within an apparatus chamber. Typically, the inorganic layer is semiconductive or resistive and has a resistivity in a range of approximately 2.0E-4 to 1.0E16 ohm·centimeters. In one embodiment, the inorganic layer comprises the active layer 306 of dome 301 depicted in FIG. 3 and the polymer layer is formed during wafer processing such as during a carbon-fluorine based plasma etch of a dielectric layer on the wafer. This wafer processing is indicated in the flow diagram of FIG. 6 by reference numeral 602. Process 600 further includes removing, as indicated by reference numeral 604, the polymer layer to expose the underlying inorganic layer. In another embodiment, the inorganic layer may be the silicon bulk material 302 of apparatus 300 as depicted in FIG. 3 or the quartz sidewall material 702 of apparatus 300 as depicted in FIG. 7. The polymer removal may include the use of a halogen containing gas such as a variety of gases including carbon and fluorine.

After exposing the inorganic layer, at least a portion of the exposed inorganic layer is etched as indicated by reference numeral 606. Etching the inorganic layer is preferably accomplished without removing dome 301 from apparatus 300. In an embodiment in which the inorganic layer comprises a semiconductor material such as silicon, etching the inorganic layer may be achieved with a conventional silicon etch process. Similarly, in an embodiment in which the exposed inorganic layer comprises a dielectric material such as a silicon-oxide, etching the exposed inorganic layer may include a dielectric etch process. In one embodiment, etching the exposed inorganic layer includes removing the outer-most layer (i.e., the layer exposed to chamber 126 of apparatus 300). In one embodiment, the etching of the exposed surface is performed with a hydrogen containing gas. If, for example, the exposed surface comprises silicon, etching the exposed surface may include etching the silicon surface with a $CHF_3$ or other suitable hydrogen containing gas.

Following the etching of the exposed surface, an optional decontamination process 608 and an optional conditioning process 610 may be performed. The optional act of decontaminating the apparatus as indicated by reference numeral 608 may comprise applying a solvent to the exposed inorganic surface and thereafter rinsing the inorganic surface with de-ionized water. A suitable solvent for use in decontamination process 608 includes isopropyl alcohol (IPA). The optional act of conditioning the chamber as indicated by reference numeral 610 may be accomplished in one embodiment by exposing the inorganic surface to the conditions that wafer 104 will encounter during subsequent processing. Conditioning is well known to skilled artisans in the field of semiconductor fabrication processing. In an embodiment, for example, where the processing of the product wafers comprises plasma etching a dielectric film using a $CH_3F$-argon mixture, the conditioning of the inorganic surface may include exposing the surface to a mixture that includes $CHF_3$, argon, and any other gases used in the baseline process.

In an embodiment in which a barrier layer 304 is incorporated into dome 301 of apparatus 300, the exposed layer may include exposed portions of the barrier layer 304. In this embodiment, process 600 may include etching portions of the barrier layer 304 as indicated by reference numeral 612. This embodiment is suitable for use with a dome 301 as depicted in FIG. 5 in which multiple active layers 306 and barrier layers 304 are formed on bulk material 302. As wafer processing contaminates the outermost active layer 306, the refurbishing process 600 is employed to remove the outermost active layer 306 and the adjacent barrier layer 304 to expose a "fresh" active layer 306 for subsequent processing. As an alternative to etching through an exposed barrier layer to expose the underlying active layer, the refurbishing of the apparatus surface may be accomplished by depositing a fresh active layer on an exposed barrier layer prior to further wafer processing. Preferably, apparatus 300 is capable of depositing a fresh active layer over an exposed barrier layer such that the refurbishing of the surface of apparatus 300 occurs without physically removing dome 301 from apparatus 300. In an embodiment in which apparatus 300 is configured to perform a plasma etch of a dielectric film and the active layer 306 comprises silicon, for example, apparatus 300 may be used to deposit silicon onto dome 301 as a means of refurbishing apparatus 300.

Thus, in one embodiment, apparatus 300 may include a bulk material 302 and multiple instances of alternating barrier layers 304 and active layers 306 including a first barrier layer, a first active layer, a second barrier layer, and a second active layer in which the second active layer lies closest to chamber 126 of apparatus 300 compared to bulk material 302, while bulk material 302 lies furthest from chamber 126. The second barrier layer lies between the first and second active layers and the first active layer lies between the second barrier layer and the first barrier layer. The first barrier layer lies between the bulk material and the first active layer. In this embodiment, etching the exposed inorganic surface includes removing the second active layer to expose the second barrier layer. The process may further include etching the second barrier layer to expose the first active layer. In this embodiment, the apparatus may be refurbished by removing one active layer and one barrier layer to expose an adjacent active layer. In another embodiment, the refurbishment of the apparatus may include forming a third active layer adjacent to the second barrier layer.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor device comprising:
    placing a substrate into an apparatus including:
        an electromagnetic source;
        a bulk material between the electromagnetic source and an interior portion of the apparatus; and
        a first barrier layer between the bulk material and the interior portion;
    creating a plasma; and
    processing the substrate.

2. The process of claim 1, wherein the apparatus further comprises a first active layer lying between the first barrier layer and the interior portion.

3. The process of claim 2, wherein the apparatus further comprises a second active layer and a second barrier layer, wherein:
    the second active layer lies closest to the interior portion compared to the first active layer, the first barrier layer, and the second barrier layer; and
    the second barrier layer lies between the first and second active layers.

4. The process of claim 2, wherein the bulk material and the first active layer have a similar property selected from a group consisting of a magnetic property, an electrical property, and a chemical property.

5. The process of claim 4, wherein the bulk material and the first active layer are electrically connected to each other.

6. The process of claim 2, wherein the first active layer comprises a material selected from a group consisting of silicon, silicon carbide, germanium, silicon germanium, silicon oxide, aluminum oxide, and aluminum nitride.

7. The process of claim 2, wherein the first active layer has a thickness at least approximately eleven microns.

8. The process of claim 1, wherein the first barrier layer comprises a material selected from a group consisting of a refractory metal and a nitride.

9. The process of claim 1, wherein the first barrier layer has a thickness of at least approximately eleven nanometers.

10. The process of claim 1, wherein processing the substrate includes removing at least a portion of a first film overlying the substrate, wherein the removing exposes an underlying film that includes a contaminant, a portion of which may reach an exposed surface within the apparatus.

11. The process of claim 10, wherein the contaminant is capable of significantly affecting an electromagnetic field within the apparatus.

12. The process of claim 10, wherein:
    the substrate has a first area;
    the exposed surface has a second area and a third area, wherein the second area occupies an area substantially equal to the first area, and wherein the third area is outside the second area;
    a concentration of a material within the third area which is less than a concentration of the material within the second area; and
    the material is a product of a reaction between the contaminant and a gaseous species.

13. The process of claim 12, wherein the contaminant includes copper.

14. A process for operating an apparatus comprising:
    forming a polymer layer along an inorganic layer, wherein:
        the polymer layer is formed within the apparatus; and
        the inorganic layer has a characteristic selected from a group of semiconductive and resistive;
    removing the polymer layer to expose the inorganic layer; and
    etching at least a portion of the inorganic layer after removing the polymer layer.

15. The process of claim 14, further comprising processing a substrate, wherein the polymer layer is formed on an exposed surface of the apparatus.

16. The process of claim 15, wherein the polymer layer is formed while etching an insulating layer overlying a substrate.

17. The process of claim 14, further comprising removing a barrier layer, wherein the barrier layer lies between the inorganic layer and a bulk material.

18. The process of claim 14, further comprising:
    providing an apparatus including a bulk material, a first barrier layer, a first active layer, a second barrier layer, and a second active layer wherein:
        the second active layer lies closest to an interior compared to the bulk material, the first barrier layer, the first active layer, and the second barrier layer;

the bulk material is farthest away from the interior compared to the first barrier layer, the first active layer, the second barrier layer and the second active layer;

the second barrier layer lies between the first and second active layers;

the first active layer lies between the second barrier layer and the first barrier layer; and the first barrier layer lies between the bulk material and the first active layer; and etching the exposed inorganic surface includes removing the second active layer to expose the second barrier layer.

19. The process of claim 18, further comprising etching the second barrier layer to expose the first active layer.

20. The process of claim 18, further comprising forming a third active layer adjacent to the second barrier layer.

* * * * *